(12) United States Patent
Sakai et al.

(10) Patent No.: US 8,409,931 B2
(45) Date of Patent: Apr. 2, 2013

(54) METHOD OF MANUFACTURING SEMICONDUCTOR DEVICE

(75) Inventors: Taiji Sakai, Kawasaki (JP); Nobuhiro Imaizumi, Kawasaki (JP); Masataka Mizukoshi, Kokubunji (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/404,521

(22) Filed: Feb. 24, 2012

(65) Prior Publication Data

US 2012/0244665 A1 Sep. 27, 2012

(30) Foreign Application Priority Data

Mar. 24, 2011 (JP) ................. 2011-066475

(51) Int. Cl.
*H01L 21/60* (2006.01)

(52) U.S. Cl. ................. 438/123; 257/E21.506

(58) Field of Classification Search .......... None
See application file for complete search history.

(56) References Cited

U.S. PATENT DOCUMENTS 5,821,627 A * 10/1998 Mori et al. ............ 257/780
2007/0008051 A1 * 1/2007 Tsuda et al. ............ 333/193

FOREIGN PATENT DOCUMENTS

JP 4-309474 11/1992
JP 5-131279 5/1993

* cited by examiner

*Primary Examiner* — Seahvosh Nikmanesh
(74) *Attorney, Agent, or Firm* — Kratz, Quintos & Hanson, LLP

(57) ABSTRACT

A method of manufacturing a semiconductor device includes: forming a first layer including crystals by processing a surface of a first electrode of a semiconductor element; forming a second layer including crystals by processing a surface of a second electrode of a mounting member on which the semiconductor element is mounted; reducing a first oxide film present over or in the first layer and a second oxide film present over or in the second layer at a first temperature, the first temperature being lower than a second temperature at which a first metal included in the first electrode diffuses in a solid state and being lower than a third temperature at which a second metal included in the second electrode diffuses in a solid state; and bonding the first layer and the second layer to each other by solid-phase diffusion.

13 Claims, 13 Drawing Sheets

FIG. 11A
FIG. 11B
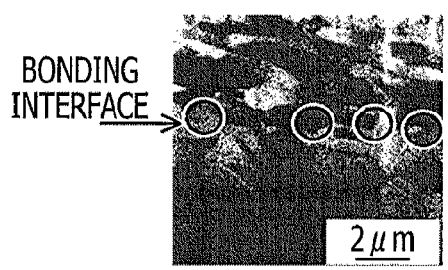
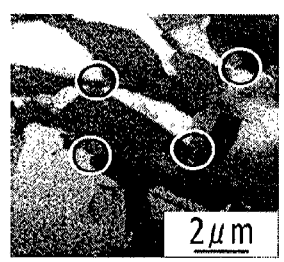
FIG. 11C
FIG. 11D
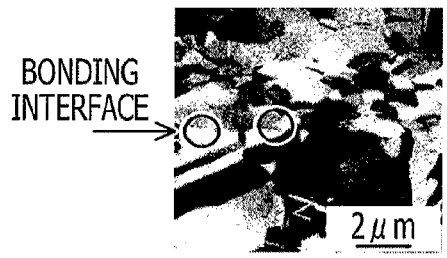
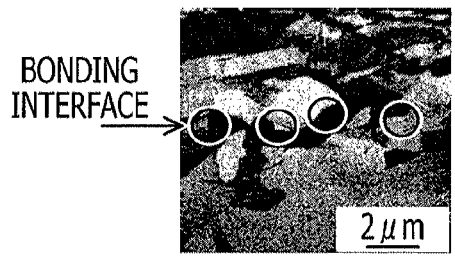

METHOD OF MANUFACTURING SEMICONDUCTOR DEVICE

CROSS-REFERENCE TO RELATED APPLICATION(S)

This application is based upon and claims the benefit of priority of the prior Japanese Patent Application No. 2011-66475, filed on Mar. 24, 2011, the entire contents of which are incorporated herein by reference.

FIELD

The embodiments discussed herein are related to methods of manufacturing semiconductor devices.

BACKGROUND

Examples of a method for mounting a semiconductor element on a circuit board or the like by flip-chip bonding include a method for soldering a semiconductor element, a method in which conductive particles are sandwiched between electrode terminals so as to be in contact with each other and are fixed with resin so as to be coupled, and a similar method.

Japanese Laid-open Patent Publications Nos. 04-309474 and 05-131279 disclose the related art.

SUMMARY

According to an aspect of the embodiments, a method of manufacturing a semiconductor device includes: forming a first layer including crystals by processing a surface of a first electrode of a semiconductor element; forming a second layer including crystals by processing a surface of a second electrode of a mounting member on which the semiconductor element is mounted; reducing a first oxide film present over or in the first layer and a second oxide film present over or in the second layer at a first temperature, the first temperature being lower than a second temperature at which a first metal included in the first electrode diffuses in a solid state and being lower than a third temperature at which a second metal included in the second electrode diffuses in a solid state; and bonding the first layer and the second layer to each other by solid-phase diffusion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 11A to 11D each illustrate an exemplary chip sample;

DESCRIPTION OF EMBODIMENTS

For example, when the pitch between electrodes is fine, the soldering of semiconductor elements may be difficult. When a semiconductor element is thin, a junction is fixed to reduce the warpage until cooling is finished, whereby treatment time may be increased.

Anisotropic conductive films prepared by dispersing conductive particles in filmy insulating resins are used to couple specific semiconductor elements such as drivers for liquid crystal displays (LCDs). The reliability of connection may be low at a temperature not lower than the glass transition temperature (Tg) of each insulating resin.

Thermocompression bonding may damage circuits in semiconductor elements because high temperature and high pressure for solid-phase diffusion are applied to electrodes.

After surfaces of electrodes are planarized by chemical mechanical polishing (CMP), the electrode surfaces are activated by argon plasma or the like in a vacuum and solid-phase diffusion bonding is performed at low temperature (surface activation bonding). When performing surface activation bonding at a temperature at which circuits in semiconductor elements are not damaged, sufficient bonding strength may not be obtained. The use of expensive vacuum equipment may cause an increase in cost.

Figure 1:
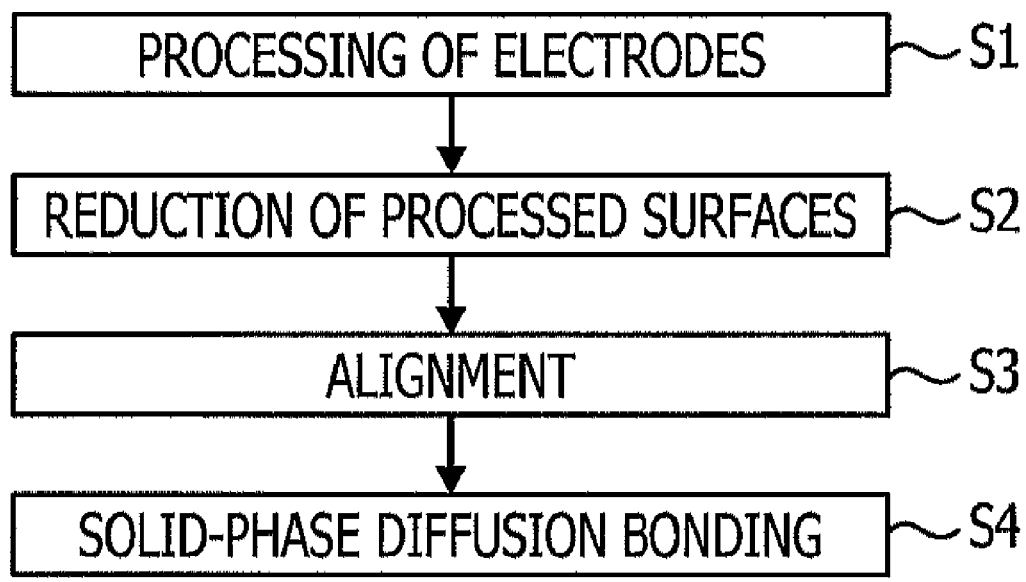
FIG. 1 illustrates an exemplary method for manufacturing a semiconductor device.

FIG. 1 illustrates an exemplary method for manufacturing a semiconductor device.

In an operation S1, surfaces of electrodes of a semiconductor element and surfaces of electrodes of a mounting member for mounting the semiconductor element are machined, whereby a microcrystalline layer with a reduced grain size due to machining is provided on a surface of each electrode. The electrodes may include at least one of, for example, Cu, Sn, Al, and Ni. Cu, Sn, Al, and Ni may be likely to be oxidized. A material for forming the electrodes of the semiconductor element may be different from a material for forming the electrodes of the mounting member. The mounting member includes, for example, a lead frame, a circuit board, or the like.

Figure 2A:
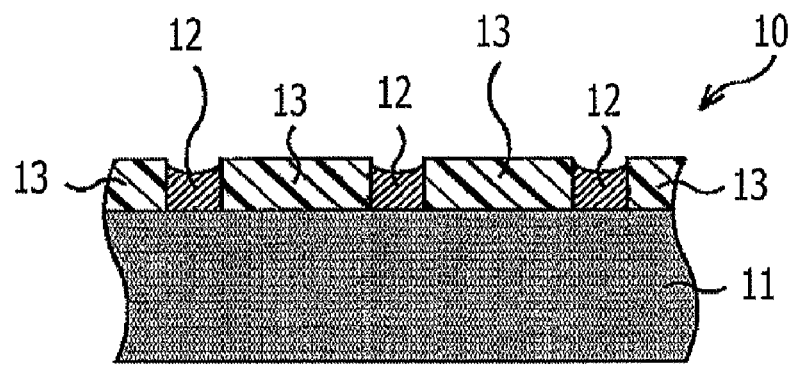
FIGS. 2A and 2B illustrate an exemplary method for manufacturing a semiconductor device.
Figure 2B:
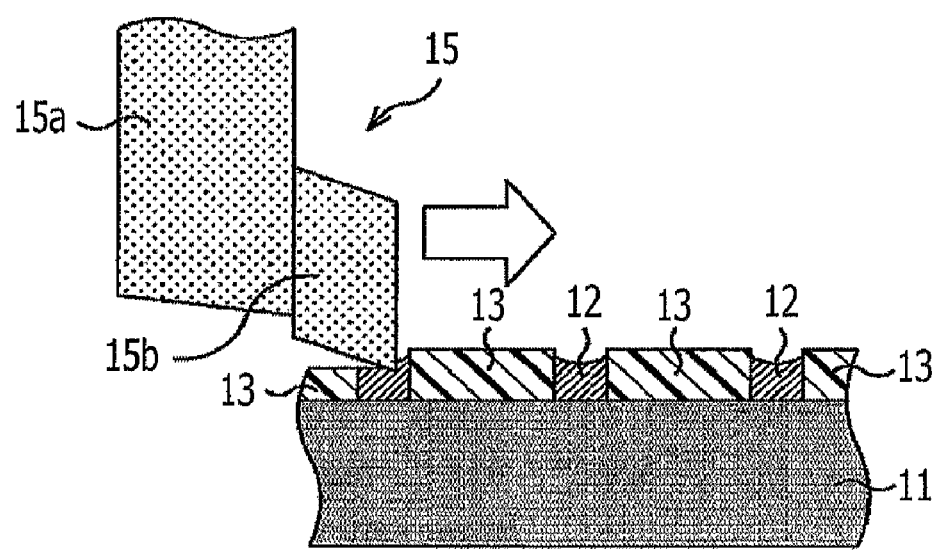

FIGS. 2A and 2B illustrate an exemplary method for manufacturing a semiconductor device. As illustrated in FIG. 2A, for example, a semiconductor element 10 includes a circuit section 11 and electrodes 12 and a resin 13 is embedded between the electrodes 12. As illustrated in FIG. 2B, surfaces of the electrodes 12 and the resin 13 are cut off with a diamond turning tool 15 including a base section 15a and a cutting section 15b. A microcrystalline layer including a large number of dislocations is formed on a surface of each electrode 12. The mounting member may be treated in substantially the same or similar way. The microcrystalline layer may have a thickness of about 100 nm.

Figure 3A:
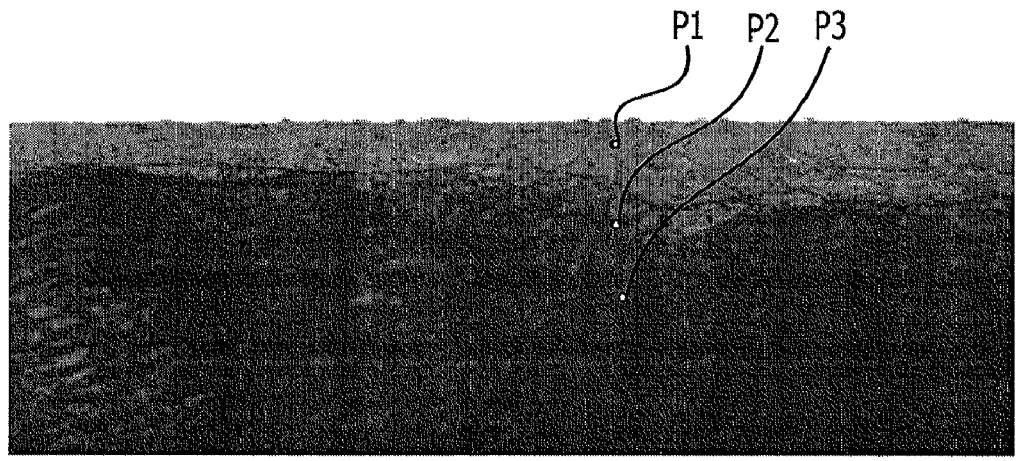
FIGS. 3A to 3D illustrate an exemplary electron diffraction pattern.
Figure 3B:
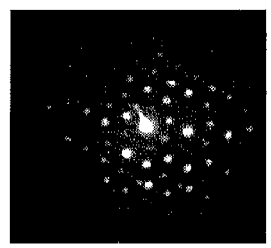
Figure 3C:
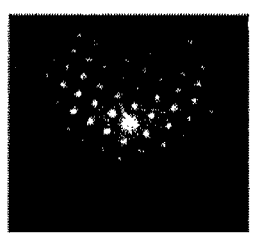
Figure 3D:
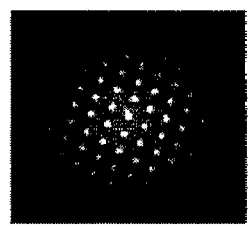

FIGS. 3A to 3D illustrate an exemplary electron diffraction pattern. The electron diffraction pattern illustrated in FIGS. 3A to 3D may be an electron diffraction pattern of the cut-off electrodes illustrated in FIG. 2A. FIG. 3A illustrates a figure corresponding to a transmission electron microscope (TEM) photograph of the cut-off electrodes. FIG. 3B illustrates an electron diffraction pattern of a site P1 illustrated in FIG. 3A. FIG. 3C illustrates an electron diffraction pattern of a site P2 illustrated in FIG. 3A. FIG. 3D illustrates an electron diffraction pattern of a site P3 illustrated in FIG. 3A. With reference to FIG. 3A, a large number of dislocations are present in a region close to the surface. As illustrated in FIGS. 3B, 3C, and 3D, the crystal orientation of a region closer to the surface is more disordered. Although being not illustrated, the dislocation density of each electrode is substantially uniform before cutting. The electron diffraction patterns of the sites P1 and P2 may be substantially the same as the electron diffraction pattern of the site P3. A microcrystalline layer with a reduced grain size due to cutting may be present on a surface of each cut-off electrode.

Machining may be grinding, sand blasting, or the like in addition to cutting.

Figure 4A:
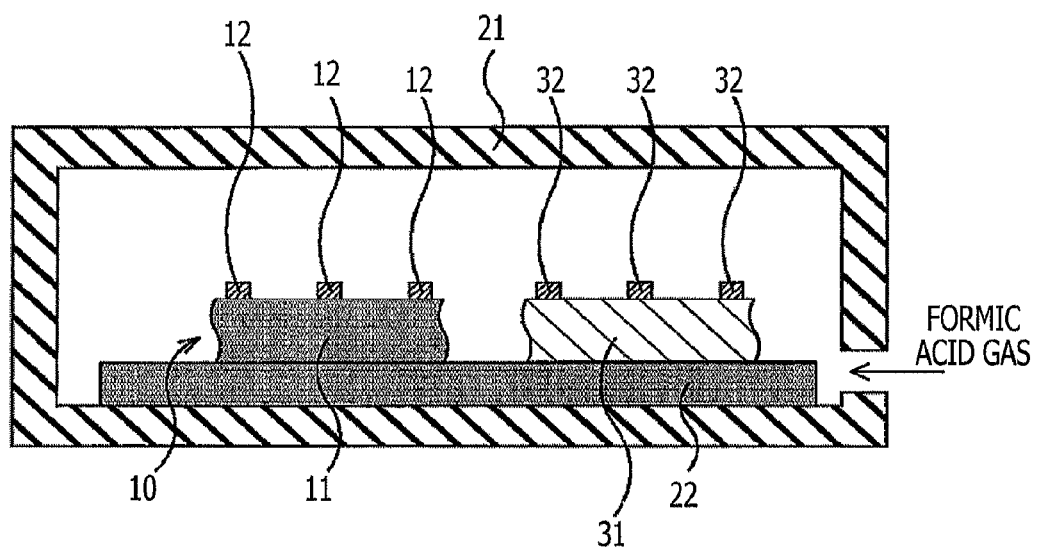
FIGS. 4A and 4B illustrate an exemplary method for manufacturing a semiconductor device.
Figure 4B:
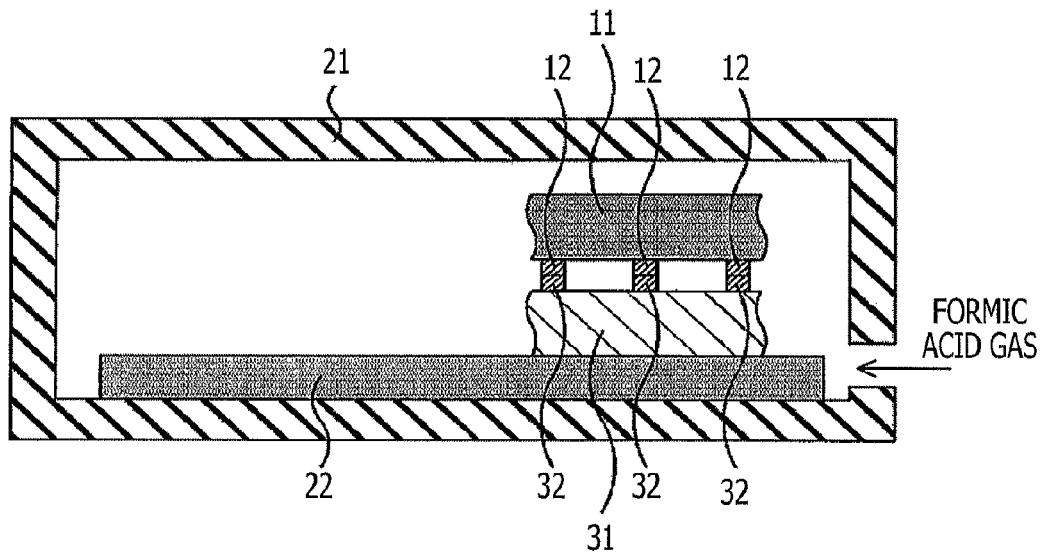

In an operation S2 illustrated in FIG. 1, after the machining of the electrode surfaces, the electrode surfaces are reduced at a temperature lower than a temperature at which solid-phase diffusion occurs in the electrodes. FIGS. 4A and 4B illustrate an exemplary semiconductor device-manufacturing method. As illustrated in FIG. 4A, for example, a circuit board 31 including electrodes 32 and the semiconductor element 10 including the electrodes 12, are placed on a stage 22 placed in a housing 21. A formic acid gas is introduced into the housing 21 and the housing 21 is heated to 120° C. The surfaces of the electrodes 12 and the electrodes 32, which have the microcrystalline layers formed by machining, are reduced.

Figure 5A:
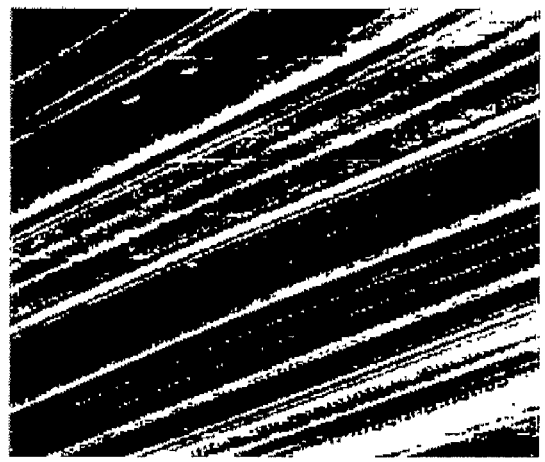
FIGS. 5A and 5B each illustrate an exemplary surface of an electrode.
Figure 5B:
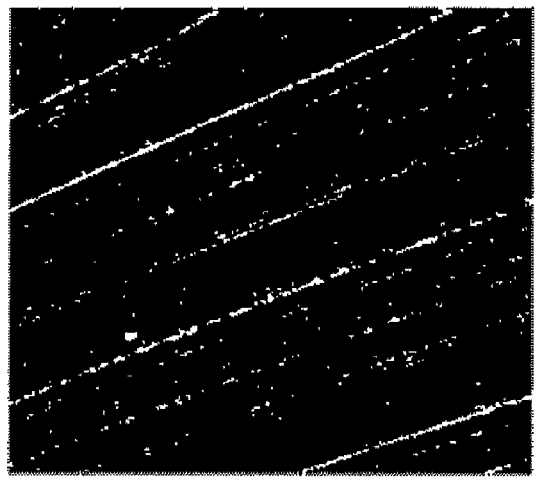

When the formic acid gas is used to perform reducing treatment, the treatment temperature may be 100° C. to 150° C. When the treatment temperature is lower than 100° C., a reducing reaction may not proceed. When the treatment temperature exceeds 150° C., the number of crystals larger than fine crystals present on a surface of each electrode may be increased because the fine crystals are recrystallized. FIGS. 5A and 5B each illustrate an exemplary surface of an electrode. The electrode surface illustrated in FIG. 5A may be a surface of a reduced electrode. In FIG. 5A, reducing treatment is performed at 120° C. In FIG. 5B, reducing treatment is performed at 180° C. Grain boundaries between relatively large crystals formed by recrystallization may be present in the electrode surface illustrated in FIG. 5B.

Formic acid, hydrogen radicals, or a carbon monoxide gas may be used as a reductant. When such hydrogen radicals are used, the treatment temperature may be 25° C. to 150° C. When the treatment temperature exceeds 150° C., the number of crystals larger than fine crystals present on the surface of each electrode may be increased because the fine crystals are recrystallized. When such a carbon monoxide gas is used, the treatment temperature may be 50° C. to 150° C. When the treatment temperature is lower than 50° C., a reducing reaction may not proceed. When the treatment temperature exceeds 150° C., the number of crystals larger than fine crystals present on the surface of each electrode may be increased because the fine crystals are recrystallized.

Figure 6A:
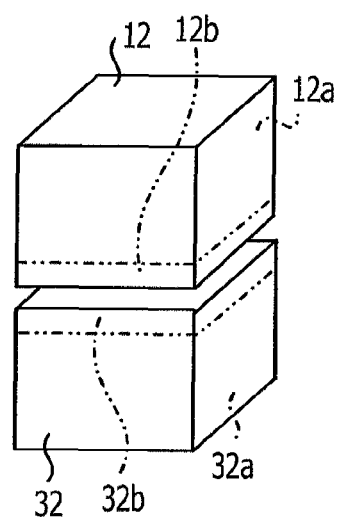
FIGS. 6A, 6B, and 6C illustrate an exemplary method for manufacturing a semiconductor device.
Figure 6B:
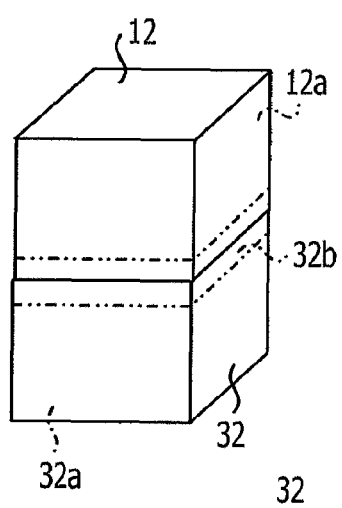
Figure 6C:
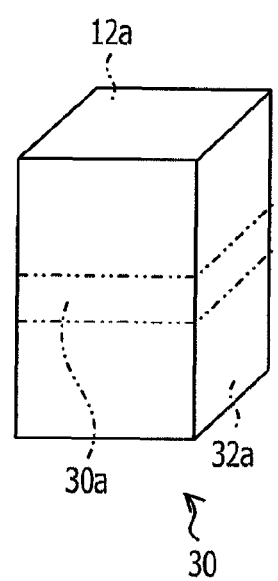

In an operation S3 illustrated in FIG. 1, after reducing treatment, the electrodes 12 of the semiconductor element 10 are aligned with the electrodes of the mounting member at a temperature lower than a temperature at which solid-phase diffusion occurs in the electrodes. FIGS. 6A, 6B, and 6C illustrate an exemplary semiconductor device-manufacturing method. As illustrated in FIG. 6A, for example, the electrodes 12 of the semiconductor element 10 are horizontally aligned with the electrodes 32 of the circuit board 31 in such a manner that the electrodes to be bonded to each other are arranged opposite to each other. A microcrystalline layer 12b is located closer to the surface of each electrode 12 than a base section 12a of the electrode 12. A microcrystalline layer 32b is located closer to the surface of each electrode 32 than a base section 32a of the electrode 32. The microcrystalline layer 12b and the microcrystalline layer 32b are arranged opposite to each other.

In an operation S4 illustrated in FIG. 1, the electrodes are bonded to each other by solid-phase diffusion in such a manner that voltages are applied between the electrodes and the electrodes are heated to a temperature at which solid-phase diffusion occurs. Solid-phase diffusion bonding may be performed in a non-oxidizing atmosphere, for example, in a vacuum or in an inert gas atmosphere. For example, the electrode 12 and electrodes 32 illustrated in FIG. 4B are brought into contact with each other, whereby the microcrystalline layer 12b and the microcrystalline layer 32b contact with each other as illustrated in FIG. 6B. Pressurizing and heating are performed and metal atoms in the microcrystalline layer 12b and metal atoms in the microcrystalline layer 32b diffuse in a solid state. A temperature at which solid-phase diffusion occurs may be about 150° C. to 250° C. As illustrated in FIG. 6C, the boundary between the electrodes 12 and 32 disappear and a connection member 30 including a bonding section 30a is formed in a region corresponding to a region in which the microcrystalline layers 12b and 32b are present. When the electrodes include substantially the same kind of metal, solid-phase diffusion tends to occur as a grain size reduces. Therefore, high bonding strength may be obtained at a temperature lower than or substantially equal to the temperature of surface activation bonding performed using bumps planarized by chemical mechanical polishing.

Since solid-phase diffusion bonding is performed between the reduced microcrystalline layers, high bonding strength may be obtained even at relatively low temperatures. In surface activation bonding performed using bumps planarized by chemical mechanical polishing, for example, heating is performed at about 250° C. to 300° C. and sufficient bonding strength may not be obtained. In the solid-phase diffusion bonding of the reduced microcrystalline layers, sufficient bonding strength may be obtained by heating at about 150° C. to 250° C.

Since no solder is used, no barrier metal such as Ti or Ni is used; hence, costs and man-hours may be reduced. Since similar metals are bonded to each other, the formation of voids due to alloying is reduced, whereby high reliability may be achieved.

Figure 7:
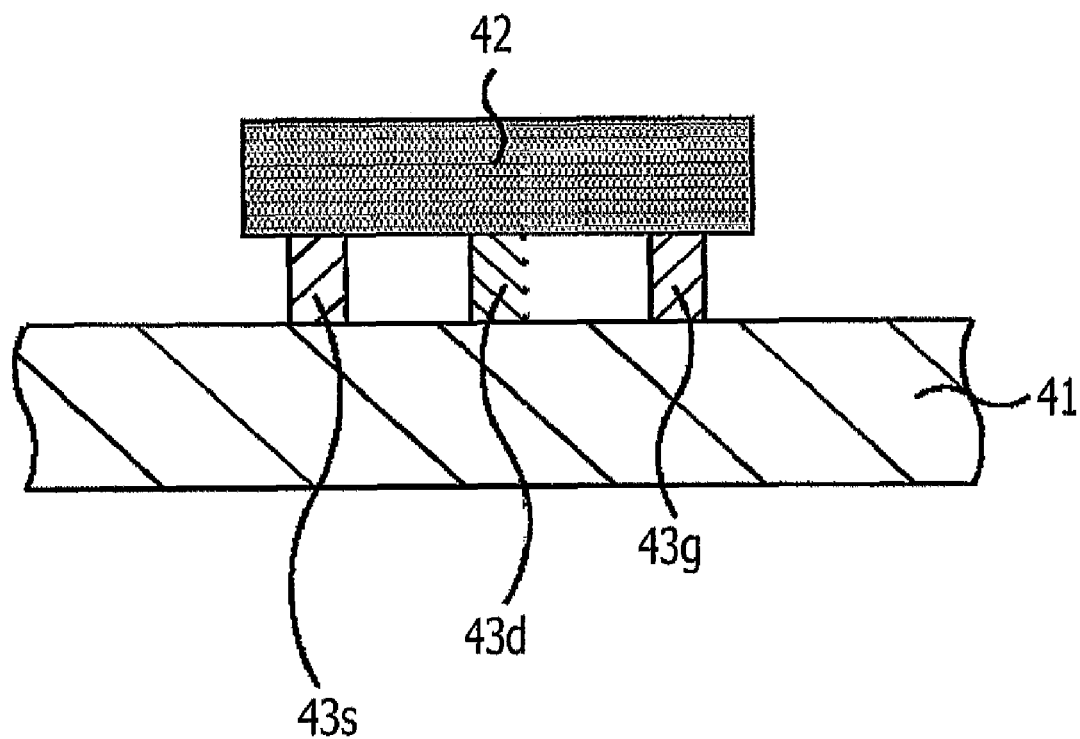
FIG. 7 illustrates an exemplary semiconductor element.

The semiconductor element may be, for example, a large-scale integration (LSI) chip, a memory, or a transistor such as a GaN high electron mobility transistor (HEMT). FIG. 7 illustrates an exemplary semiconductor element. The semiconductor element illustrated in FIG. 7 may be a GaN HEMT 42 mounted on a circuit board 41. The circuit board 41 and the GaN HEMT 42 are coupled to each other with a source connection member 43s, a drain connection member 43d, and a gate connection member 43g. The source connection member 43s, the drain connection member 43d, and the gate connection member 43g are coupled to a source, drain, and gate, respectively, of the GaN HEMT 42. The circuit board 41 may include, for example, a copper-clad laminate.

Figure 8A:
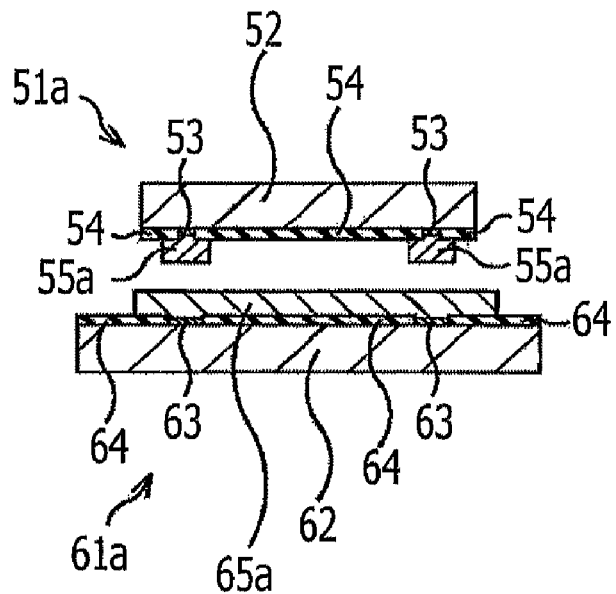
FIGS. 8A and 8B each illustrate an exemplary sample.
Figure 8B:
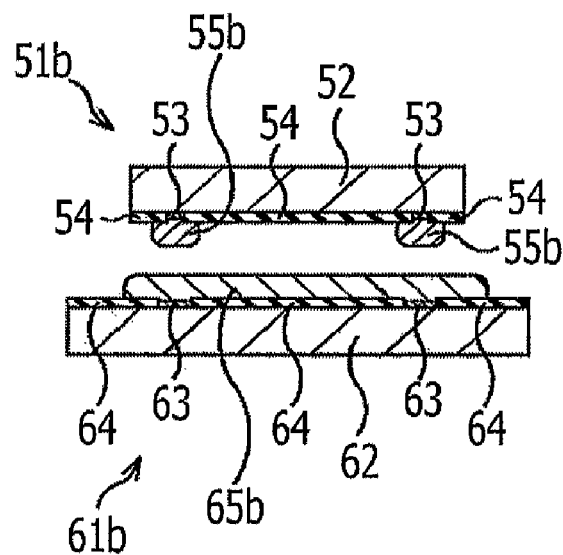

FIGS. 8A and 8B each illustrate an exemplary sample. For example, a chip sample 51a illustrated in FIG. 8A may be prepared by cutting, reduction, alignment, and solid-phase diffusion bonding as described above. For example, a chip sample 51b illustrated in FIG. 8B may be prepared by CMP instead of cutting and by reduction, alignment, and solid-phase diffusion bonding.

As illustrated in FIG. 8A, the chip sample 51a and a circuit board sample 61a are bonded together. In the preparation of the chip sample 51a, conductive layers 53 and an insulating layer 54 are formed on a surface of a S1 substrate 52 and bumps 55a are formed on the conductive layers 53. The surface of each bump 55a is cut off, whereby a microcrystalline layer is formed. In the preparation of the circuit board sample 61a, conductive layers 63 and an insulating layer 64 are formed on a surface of a S1 substrate 62 and a plate bump 65a is formed on the conductive layers 63. The surface of the plate bump 65a is cut off, whereby a microcrystalline layer is formed. A Cu electrode may be used as a bump material. Since the hardness of the Cu electrode is higher than the hardness of an Au electrode, a thick microcrystalline layer may be formed. As for cutting, a fly cutting process using a single-crystalline diamond turning tool may be used. In the fly cutting process, all workpieces, for example, bumps, formed on a wafer are machined at substantially the same speed, whereby a microcrystalline layer on the surface of each bump may have substantially a uniform thickness. An R-shaped diamond turning tool with a nose diameter of 10 mm may be used. The edge of the turning tool may have a nose radius of 50 nm to 300 nm.

As illustrated in FIG. 8B, the chip sample 51b and a circuit board sample 61b are bonded together. In the preparation of the chip sample 51b, conductive layers 53 and an insulating layer 54 are formed on a surface of a S1 substrate 52 and bumps 55b are formed on the conductive layers 53. Surfaces of the bumps 55b are subjected to CMP. In the preparation of the circuit board sample 61b, conductive layers 63 and an insulating layer 64 are formed on a surface of a S1 substrate 62 and a plate bump 65b is formed on the conductive layers 63. A surface of the plate bump 65b is subjected to CMP. In CMP, a hydrogen peroxide slurry and an abrasive pad made of polyurethane may be used.

The chip samples 51a and 51b may have a size of 5 mm×5 mm×0.6 mm. In the chip sample 51a, 392 of the bumps 55a are arranged on a peripheral section of the chip sample 51a. In the chip sample 51b, 392 of the bumps 55b are arranged on a peripheral section of the chip sample 51b. The pitch between the bumps 55a and the pitch between the bumps 55b may be 40 μm. The bumps 55a and 55b may have a size of 25 mm×25 mm×0.008 mm. The circuit board samples 61a and 61b may have a size of 5 mm×5 mm×0.6 mm. The plate bumps 65a and 65b may have a size of 10 mm×10 mm×0.6 mm and may be arranged one by one. In order to avoid errors due to misalignment, a large plate bump may be used. The accuracy of alignment may not be taken into account depending on a plate bump used.

The chip samples 51a and 51b are reduced at a temperature of 120° C. for 30 minutes using a formic acid gas. Since the plate bumps 65a and 65b are used, alignment may be simply performed. In solid-phase diffusion bonding (thermocompression bonding), two different bonding temperatures may be used, the bonding time may be set to 30 minutes, and the bonding pressure may be set to 300 MPa.

Figure 9A:
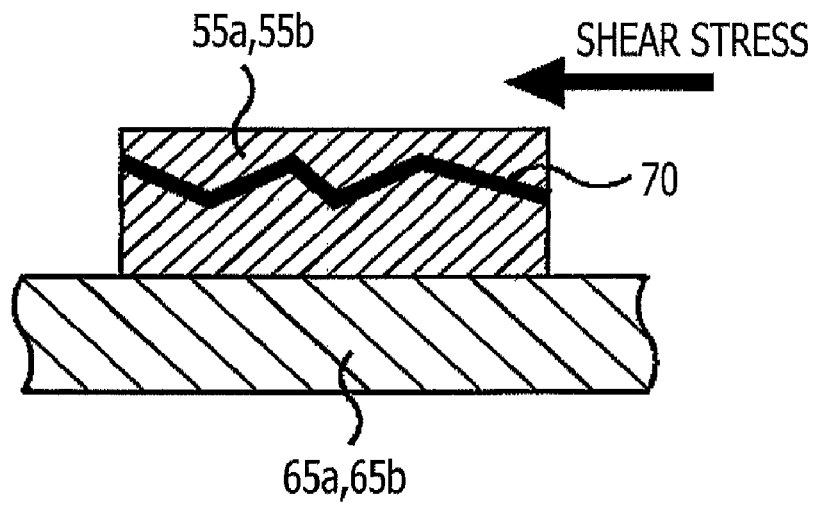
FIGS. 9A and 9B each illustrate an exemplary fracture.
Figure 9B:
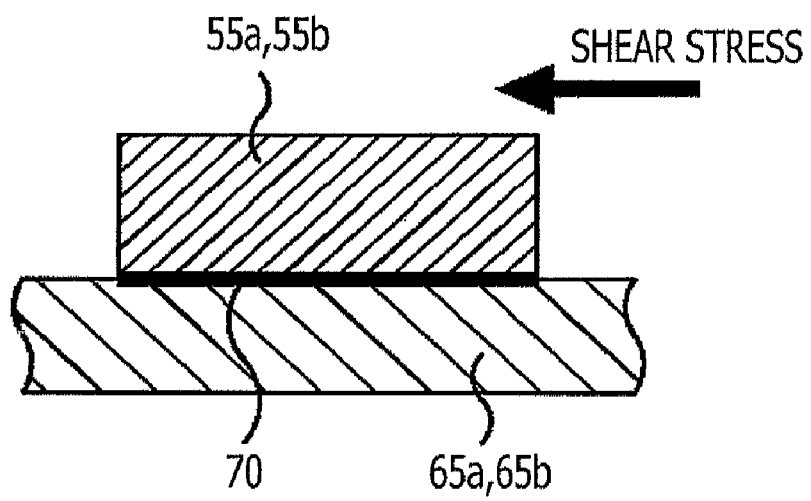

The chip samples 51a and 51b are subjected to a die shear test and bonding interfaces are observed. In the die shear test, for example, the shear strength is measured and the fracture mode percentage is investigated. FIGS. 9A and 9B each illustrate an exemplary fracture. FIG. 9A illustrates a bulk fracture in which a breakage 70 is caused in one of the bumps 55a or 55b. FIG. 9B illustrates an interface fracture in which a breakage 70 is caused at the interface between one of the bumps 55a or 55b and the plate bump 65a or the 65b, respectively. In the investigation of the fracture mode percentage, the percentage of the number of bulk fractures in the sum of the number of the bulk fractures and the number of interface fractures. In the observation of a bonding interface, a region near the bonding interface is processed with a focused ion beam (FIB) and a cross section including the bonding interface is observed with a scanning electron microscope (SEM).

Figure 10A:
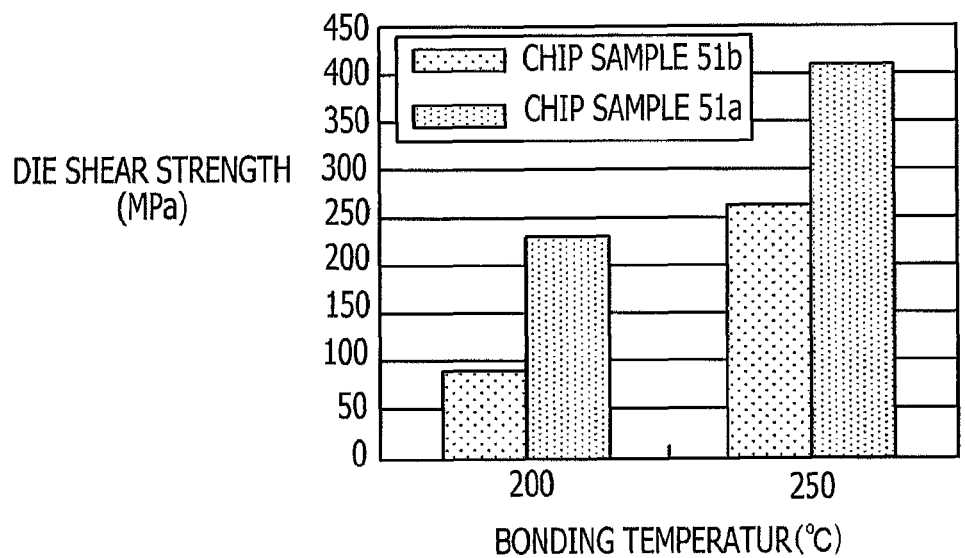
FIG. 10A illustrates an exemplary relationship between bonding temperature and die shear strength.
Figure 10B:
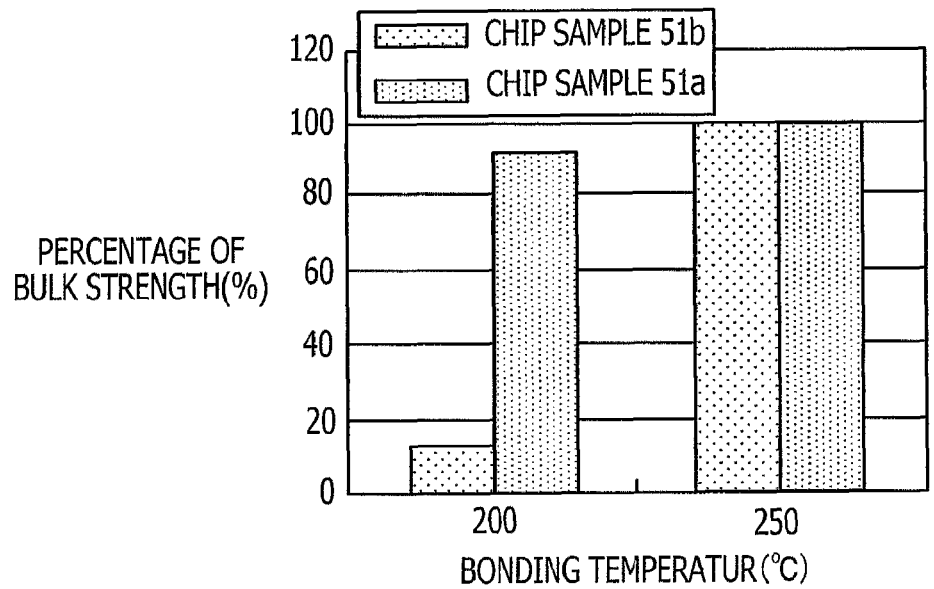
FIG. 10B illustrates an exemplary relationship between bonding temperature and percentage of bulk fractures.

FIG. 10A illustrates an exemplary relationship between bonding temperature and die shear strength. FIG. 10B illustrates an exemplary relationship between bonding temperature and percentage of bulk fractures. As illustrated in FIG. 10A, the chip sample 51a has a shear strength that is about two times that of the chip sample 51b at a bonding temperature of 200° C. and 250° C. As illustrated in FIG. 10B, in the chip sample 51a, the percentage of bulk fractures is close to 100% at a bonding temperature of 200° C. and 250° C. In the chip sample 51b, the percentage of bulk fractures is low at a bonding temperature of 200° C. In the chip sample 51a, high bonding structure may be obtained by solid-phase diffusion bonding at about 200° C.

FIGS. 11A to 11D each illustrate an exemplary chip sample. FIGS. 11A to 11D may be illustrations corresponding to SEM photographs. FIG. 11A illustrates a chip sample 51a prepared at a bonding temperature of 200° C. FIG. 11B illustrates a chip sample 51a prepared at a bonding temperature of 250° C. FIG. 11C illustrates a chip sample 51b prepared at a bonding temperature of 200° C. FIG. 11D illustrates a chip sample 51b prepared at a bonding temperature of 250° C. Circles illustrated in FIGS. 11A to 11D indicate the presence of voids. As illustrated in FIG. 11A, most bonding interfaces are lost, slight bonding interfaces are observed, and slight voids may be present at a bonding temperature of 200° C. As illustrated in FIG. 11B, a small number of voids are present and bonding interfaces are, however, lost at a bonding temperature of 250° C. Since voids adjacent to bonding surfaces migrate due to solid-phase diffusion and recrystallization, voids may be scattered. Bonding interfaces may be lost due to the recrystallization of fine crystals. As illustrated in FIGS. 11C and 11D, in the chip sample 51b, bonding interfaces are observed in wide regions independently of bonding temperature. The number of microcrystalline layers is reduced by the action of a treatment solution after CMP and therefore no recrystallization may occur.

Figure 12A:
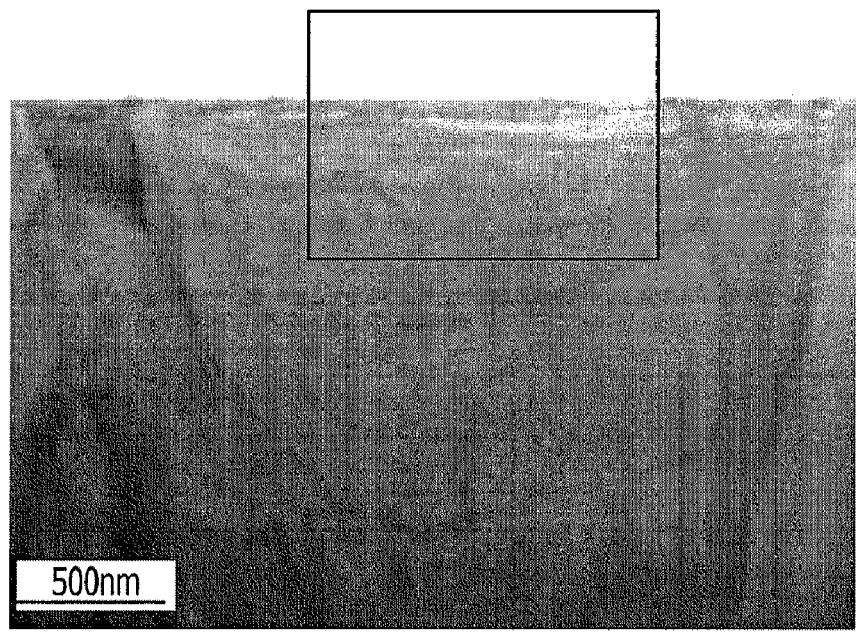
FIGS. 12A and 12B illustrate an exemplary electrode.
Figure 12B:
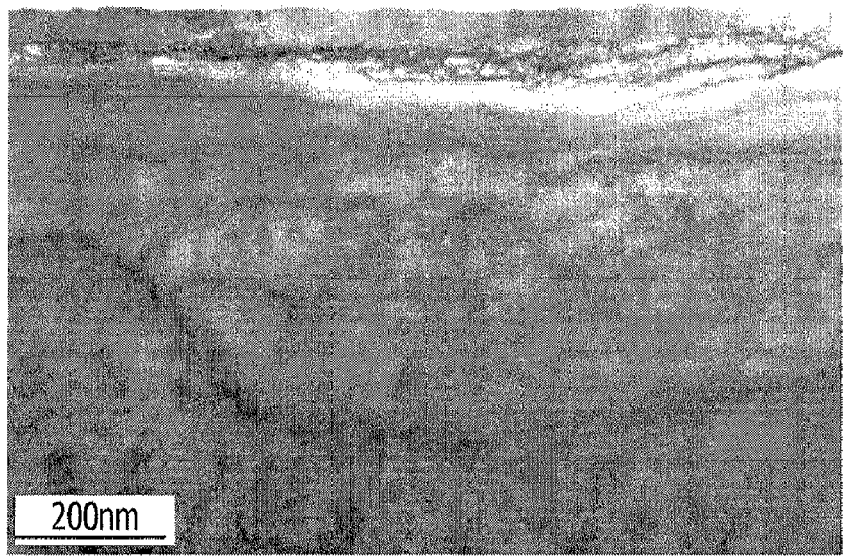
Figure 13A:
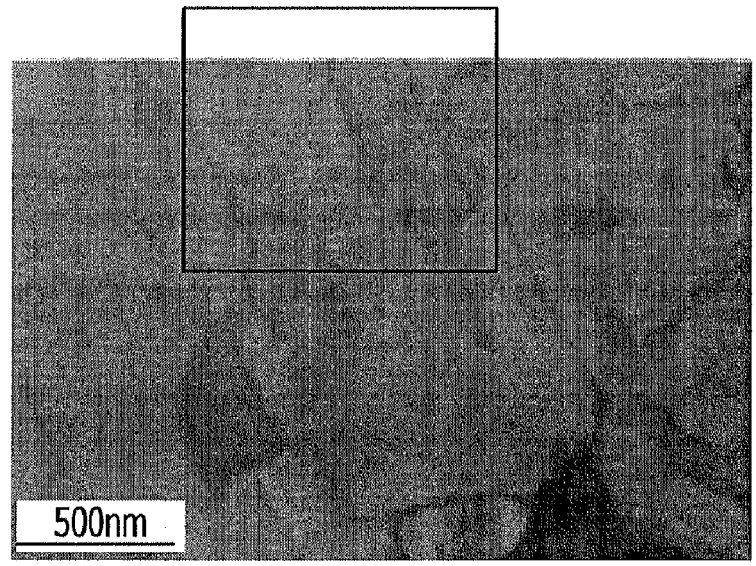
FIGS. 13A and 13B illustrate an exemplary electrode.
Figure 13B:
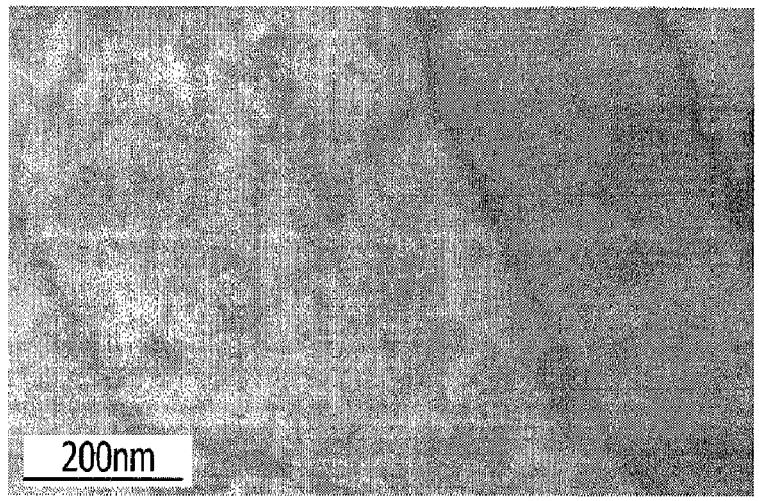

FIGS. 12A and 12B each illustrate an exemplary electrode. FIGS. 12A and 12B may correspond to TEM photographs of electrodes of a chip sample 51a. FIGS. 13A and 13B each illustrate an exemplary electrode. FIGS. 13A and 13B may correspond to TEM photographs of electrodes of a chip sample 51b. A region illustrated in FIG. 12B and a region illustrated in FIG. 13B may correspond to a quadrangle illustrated in FIG. 12A and a quadrangle illustrated in FIG. 13A, respectively. As illustrated in FIGS. 12A and 12B, in the chip sample 51a, a region including fine crystal grains is present in a surface section. As illustrated in FIGS. 13A and 13B, large crystal grains are present over the whole chip sample 51b. The possibility of recrystallization depends on the difference between structures and therefore differences between bonding strengths may be caused.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device comprising:
    forming a first layer including crystals by processing a surface of a first electrode of a semiconductor element;
    forming a second layer including crystals by processing a surface of a second electrode of a mounting member on which the semiconductor element is mounted;
    reducing a first oxide film present over or in the first layer and a second oxide film present over or in the second layer at a first temperature, the first temperature being lower than a second temperature at which a first metal included in the first electrode diffuses in a solid state and being lower than a third temperature at which a second metal included in the second electrode diffuses in a solid state; and
    bonding the first layer and the second layer to each other by solid-phase diffusion.

2. The method according to claim 1, wherein the processing includes cutting.

3. The method according to claim 1, wherein the first layer and the second layer are recrystallized during the bonding.

4. The method according to claim 1, wherein the first layer and the second layer are in contact with each other at the first temperature before the bonding.

5. The method according to claim 1, wherein the first metal and the second metal include a material selected from the group consisting of Cu, Sn, Al, and Ni.

6. The method according to claim 1, wherein the mounting member includes a lead frame or a circuit board.

7. The method according to claim 1, wherein the first temperature is 100° C. to 150° C. and formic acid is used as a reductant.

8. The method according to claim 1, wherein the first temperature is 25° C. to 150° C. and hydrogen radicals is used as a reductant.

9. The method according to claim 1, wherein the first temperature is 50° C. to 150° C. and carbon monoxide is used as a reductant.

10. The method according to claim 1, wherein the semiconductor element includes a high electron mobility transistor.

11. The method according to claim 1, wherein the bonding is performed at a temperature of 150° C. to 250° C.

12. The method according to claim 1, wherein the bonding is performed in a non-oxidizing atmosphere.

13. The method according to claim 1, wherein the processing includes planarizing a surface of the first electrode and a surface of the second electrode.

* * * * *